United States Patent
Hawkins et al.

(10) Patent No.: US 10,297,706 B2
(45) Date of Patent: May 21, 2019

(54) CONFORMAL PHOTOCONDUCTIVE SWITCH PACKAGE

(71) Applicant: Lawrence Livermore National Security, LLC, Livermore, CA (US)

(72) Inventors: Steven A. Hawkins, Livermore, CA (US); George J. Caporaso, Livermore, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 172 days.

(21) Appl. No.: 15/612,134

(22) Filed: Jun. 2, 2017

(65) Prior Publication Data
US 2018/0351025 A1     Dec. 6, 2018

(51) Int. Cl.
| | | |
|---|---|---|
| *H01L 31/12* | (2006.01) | |
| *H01L 31/09* | (2006.01) | |
| *H03K 17/78* | (2006.01) | |
| *H01L 31/16* | (2006.01) | |
| *H01L 23/48* | (2006.01) | |

(52) U.S. Cl.
CPC .............. *H01L 31/12* (2013.01); *H01L 23/48* (2013.01); *H01L 31/09* (2013.01); *H01L 31/16* (2013.01)

(58) Field of Classification Search
CPC ......... H01L 31/12; H01L 23/48; H01L 31/16; H01L 31/09
USPC .......................................... 250/214 SW, 551
See application file for complete search history.

(56) References Cited

U.S. PATENT DOCUMENTS

| | | | | |
|---|---|---|---|---|
| 6,263,124 B1* | 7/2001 | Min | ........................ | H01J 61/00 250/214 LS |
| 9,171,988 B2* | 10/2015 | Caporaso | ................ | H01L 31/09 |

OTHER PUBLICATIONS

C. J. Tranter. "On Some Dual Integral Equations", The Quarterly Journal of Mathematics, vol. 2, Issue 1, Jan. 15, 1951, pp. 60-66, https://Doi.Org/10.1093/Qmath/2.1.60.
O. Laporte and R. G. Fowler. "Resistance of a Plasma Slab Between Juxtaposed Disk Electrodes", Phys. Rev., vol. 148, No. 1, Aug. 5, 1966, 6 pp.
O. Laporte and R. G. Fowler. "Weber's Mixed Boundary Value Problem in Electrodynamics", Journal of Mathematical Physics, vol. 8, No. 3, Mar. 1967, 6pp, https//fc.doi.org/10.1063/1.1705226.
(Continued)

*Primary Examiner* — Seung C Sohn
(74) *Attorney, Agent, or Firm* — Harness, Dickey & Pierce, PLC

(57) ABSTRACT

A photoconductive switch is disclosed having a substrate, an electrode formed on the substrate, and a dielectric formed adjacent to the substrate and the electrode. The dielectric, the electrode and the substrate each have a portion cooperatively defining an interface area. The interface area of the dielectric has a doping making the interface area of the dielectric electrically conductive to suppress a charge collection at the interface area when the photoconductive switch is electrically energized through an input signal irradiating the electrode. In one embodiment the electrode may have a curvilinear or spherical shape, and the substrate may have a boundary edge surface which extends normal to the surface of the electrode, and with the dielectric having an edge surface that matches the contour of the substrate edge surface.

15 Claims, 5 Drawing Sheets

(56) References Cited

OTHER PUBLICATIONS

J. D. Wiley and J. G. Webster. "Analysis and Control of the Current Distribution Under Circular Dispersive Electrodes", IEEE Trans. on Biomed. Eng., vol. 29, No. 5, 1982, pp. 381-385.
Yizhuang Song et al. "Optimal Geometry Toward Uniform Current Density Electrodes", IOP Publishing, Ltd., Inverse Problems, vol. 27, No. 7, Jun. 3, 2011, 18 pp.
Vessela T. Krasteva et al. "Estimation of Current Density Distribution Under Electrodes for External Defibrillation", BioMedical Engineering OnLine, vol. 1, No. 7, 2002, pp. 1-13.

* cited by examiner

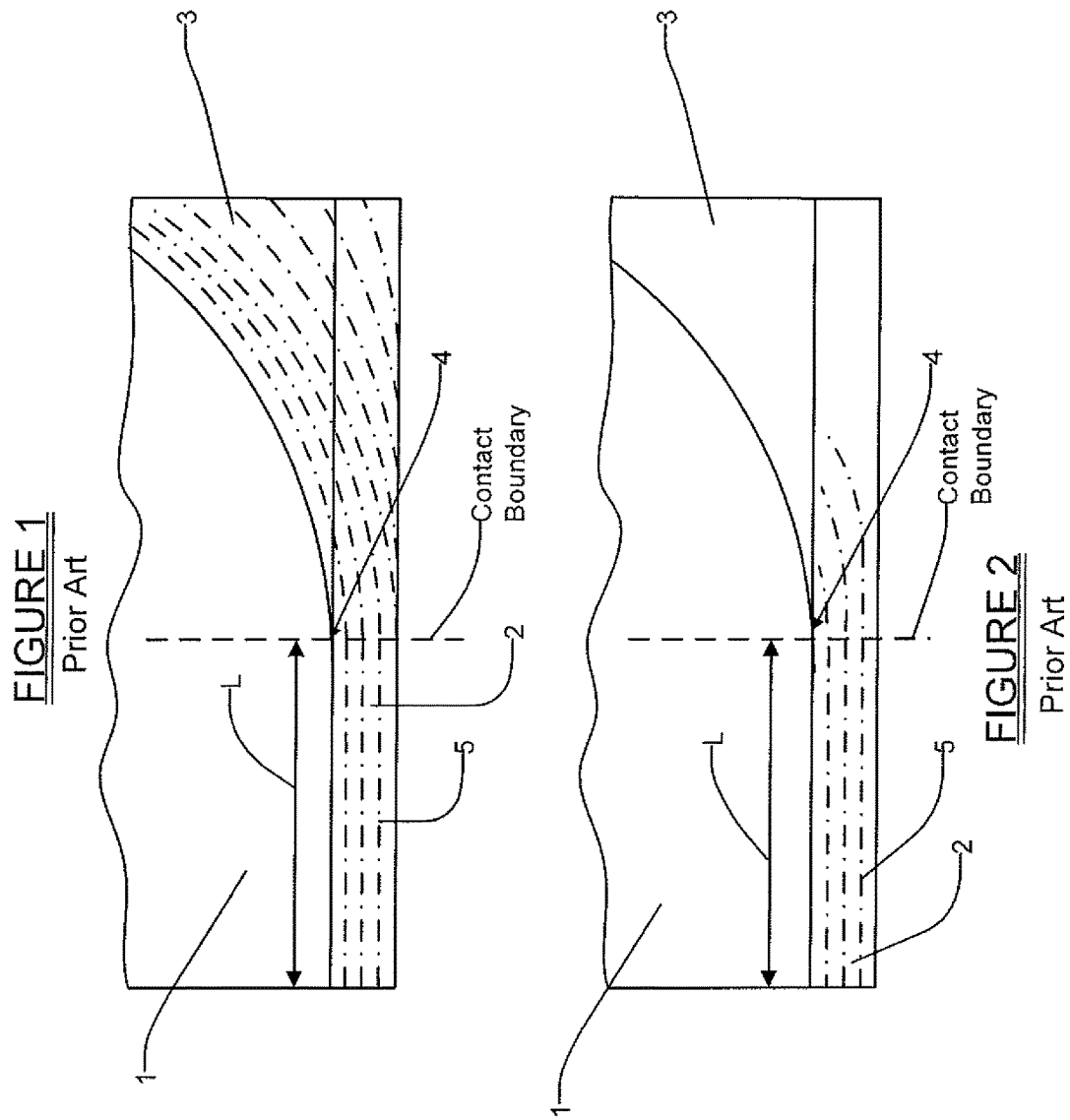

CONFORMAL PHOTOCONDUCTIVE SWITCH PACKAGE

FIELD

The present disclosure relates to photoconductive switches, and more particularly to systems and methods relating to photoconductive switches that suppress or eliminate the usual enhancement of electric field potential that occurs at the interface of an electrode, a substrate and a dielectric of the photoconductive switch.

BACKGROUND

This section provides background information related to the present disclosure which is not necessarily prior art.

Photoconductive switches have been widely used in a wide variety of applications where incident radiation is used to trigger an electrical switch. One challenge that occurs with photoconductive switches is the electric field enhancement that occurs when a photoconductive substrate is rendered conducting by the application of incident radiation. If a portion of the substrate borders a non-conducting material which is adjacent to an electrode that is also in contact with the substrate, then when the substrate is rendered conducting the electric field will be expelled from the substrate that is in contact with the non-conducting material. This causes a large field enhancement to occur at an area known as the "Triple Point." The Triple Point is the area where the conductor (i.e., electrode), the substrate supporting the conductor, and a non-conductor are in contact. This is illustrated in the simplified side cross-sectional views of FIGS. 1 and 2, where a portion of an electrode 1 resides on a substrate 2, and the electrode 1 and substrate 2 are interfaced with a dielectric 3. The Triple Point 4 is the area of interface of these three regions (i.e., the Contact Boundary dashed line extends through the Triple Point 4). FIG. 1 shows that the equipotential at the Triple Point is not substantially enhanced from its average value between the flat portion of the electrode, where the flat portion is denoted by length "L". FIG. 2 shows the substrate 2 after it is has been rendered conducting. The equipotential lines 5 have been expelled from the portion of the substrate 2 which is in contact with the dielectric 3. This extreme distortion of the equipotentials around the Triple Point 4 results in a large field enhancement at this point that this not present when the substrate 2 is in the off state. It is believed that the reason for this is that when charge carriers are present, they move to the substrate-dielectric boundary to shield the interior of the substrate from an external electric field. The result is a charge accumulation of close to the Triple Point that generates a nearly singular electric field.

Careful design of the electrode shape can help to substantially reduce the electric field enhancement that occurs at the triple point when the substrate is non-conducting. However, once the substrate is activated, a large field enhancement still appears because carriers in the substrate, unable to move into the non-conducting material, accumulate at the interface. This causes a large field distortion at the triple point.

Previous design work involving switch packaging has considered electric field distributions in the state where the photoconductive substrate is non-conducting. It is under this condition that the voltage across the device will be at its maximum value. It has been found experimentally that when the substrates were illuminated to render them conductive, electrical breakdowns were found to occur at lower voltages than the package could withstand in the absence of illumination. A study of the electric field distribution in the case when the substrate is conducting revealed the presence of a new field enhancement due to carrier charge accumulation at the substrate boundary. This phenomenon appears to have been first noticed in the medical industry when electrodes were applied to the human body. Burns occurred on the skin at the edges of the electrodes due to this mechanism. Application of an additional conducting material between the electrode and the skin (that extended beyond the electrode) was found to modify the field distribution.

SUMMARY

This section provides a general summary of the disclosure, and is not a comprehensive disclosure of its full scope or all of its features.

In one aspect the present disclosure relates to a photoconductive switch. The switch may comprise a substrate, an electrode formed on the substrate, and a dielectric formed adjacent to the substrate and the electrode. The dielectric, the electrode and the substrate each may include a portion cooperatively defining an interface area. The interface area of the dielectric may include a doping making the interface area of the dielectric electrically conductive to suppress a charge collection at the interface area when the photoconductive switch is electrically energized through an input signal irradiating the electrode.

In another aspect the present disclosure relates to a photoconductive switch. The switch may comprise a substrate having a conducting portion and non-conducting material portions arranged on opposing side edges of the conducting portion. An electrode may be formed on the substrate. A dielectric may be formed adjacent to the non-conducting material portions. The dielectric may have material portions each forming an interface area with the non-conducting material portions on opposing edges of the non-conducting material portions. The interface area may be operative to suppress a charge collection at the interface area when the photoconductive switch is electrically energized through an input signal irradiating the electrode.

In another aspect the present disclosure relates to a photoconductive switch that may have a substrate and an electrode formed on the substrate. The substrate may have a first boundary edge surface and a dielectric may be formed adjacent to the first boundary edge surface of the substrate and adjacent to the spherical electrode. The dielectric may have a second boundary edge surface conforming to the first boundary edge surface and to at least a portion of the electrode. An intersection of the first and second boundary edge surfaces forms a plane normal to the spherical surface of the electrode.

In still another aspect the present disclosure relates to a method for forming a photoconductive switch. The method may comprise forming a substrate, forming an electrode on the substrate, and arranging a dielectric formed adjacent to the substrate and the electrode. The dielectric, the electrode and the substrate may each include a portion cooperatively defining an interface area. At the interface area, the dielectric may include a doping making the interface area of the dielectric electrically conductive to suppress a charge collection at the interface area when the photoconductive switch is electrically energized through an input signal irradiating the electrode.

Further areas of applicability will become apparent from the description provided herein.

The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 1 illustrates equipotential field lines of an electrode/substrate/dielectric photoconductive switch structure when the switch is in a non-conducting state;

FIG. 2 illustrates the switch of FIG. 1 but with the switch in the conducting state, illustrating the marked field enhancement due to the sharp bending of the equipotential lines at the Triple Point when the switch is in its conducting state;

Figure 5:
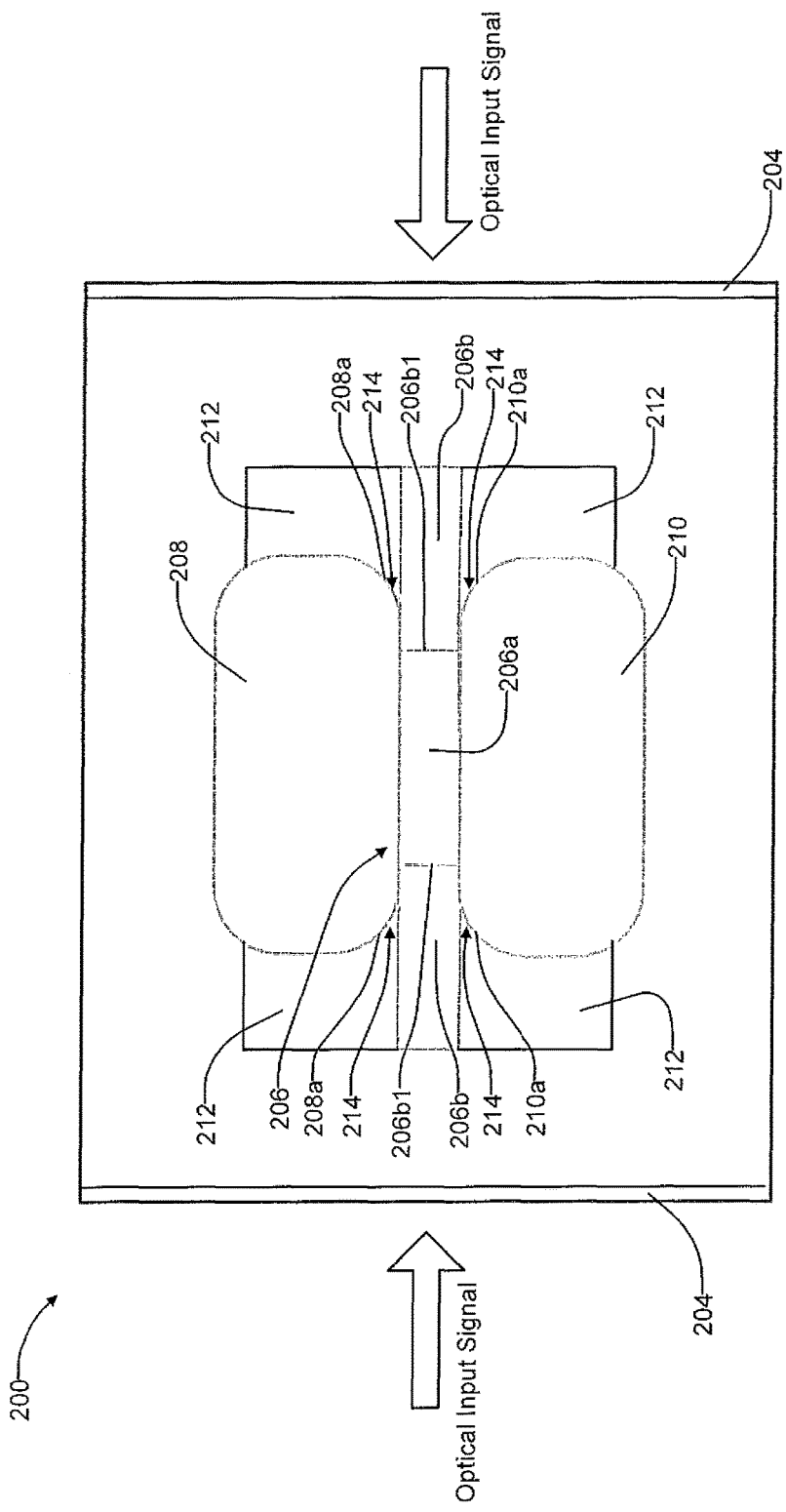
Figure 6:
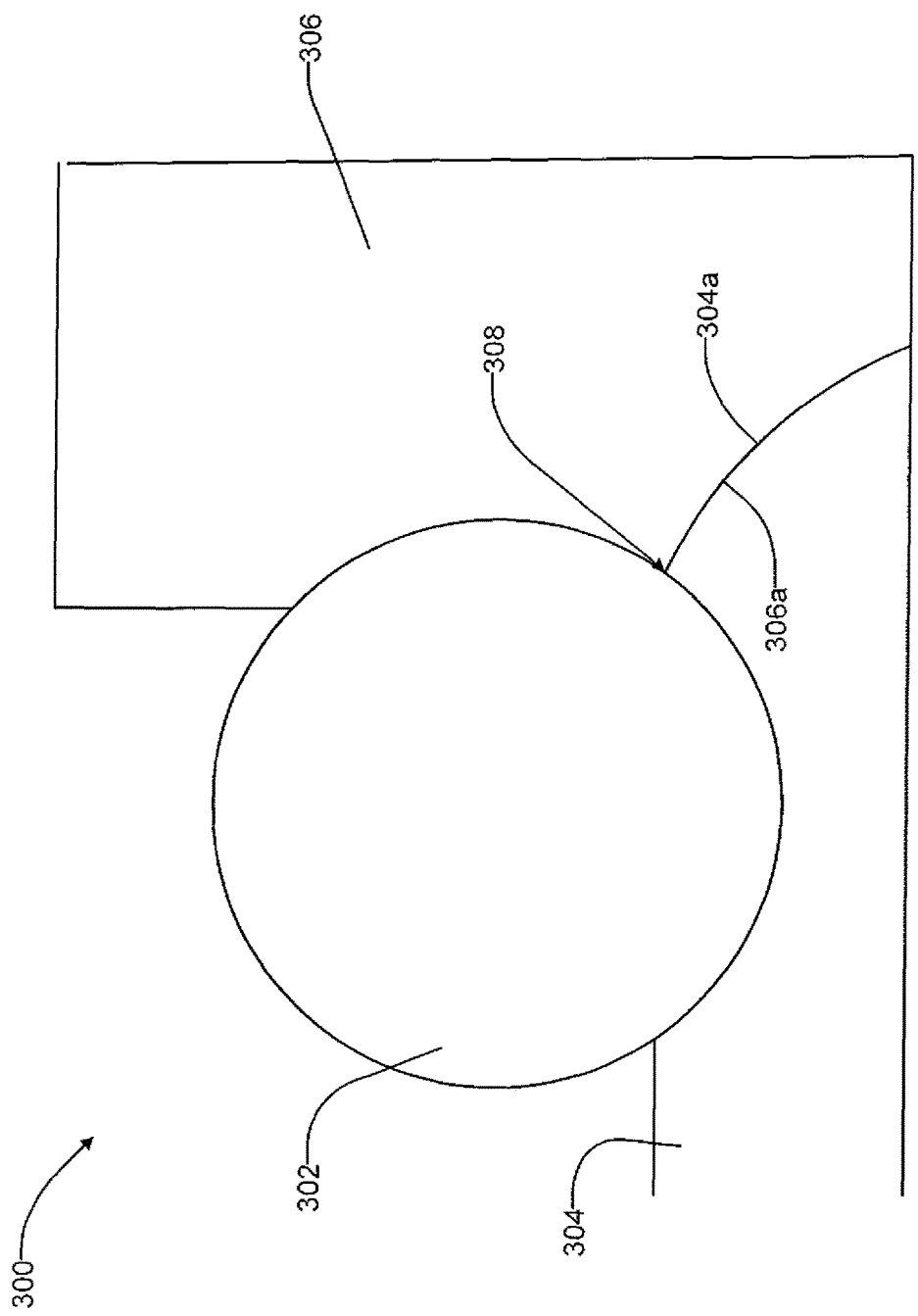

FIG. 5 shows another embodiment of a photoconductive switch in accordance with the present disclosure where the portion of the substrate adjacent to the dielectric is made from a non-conducting material; and FIG. 6 illustrates a photoconductive switch construction in accordance with another embodiment of the present disclosure which a uses a spherically shaped electrode, and where the substrate boundary has an arc shape chosen to conform to the electric field line when the substrate is in the "Off" state.

Corresponding reference numerals indicate corresponding parts throughout the several views of the drawings.

DETAILED DESCRIPTION

Example embodiments will now be described more fully with reference to the accompanying drawings.

Figure 3:
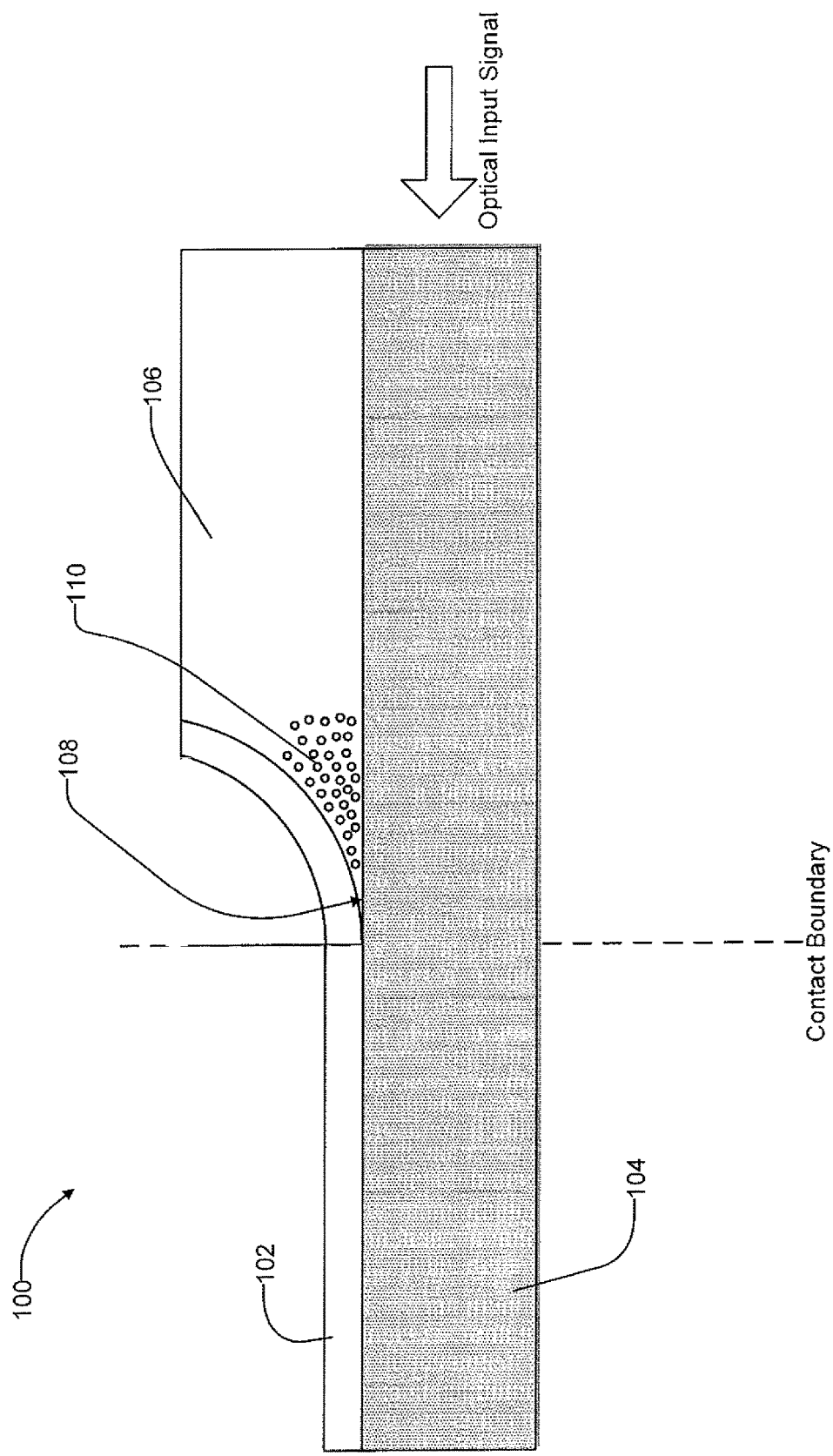
FIG. 3 illustrates a photoconductive switch with its dielectric material including doping around the Triple Point to make the dielectric region partially conducting.
Figure 4:
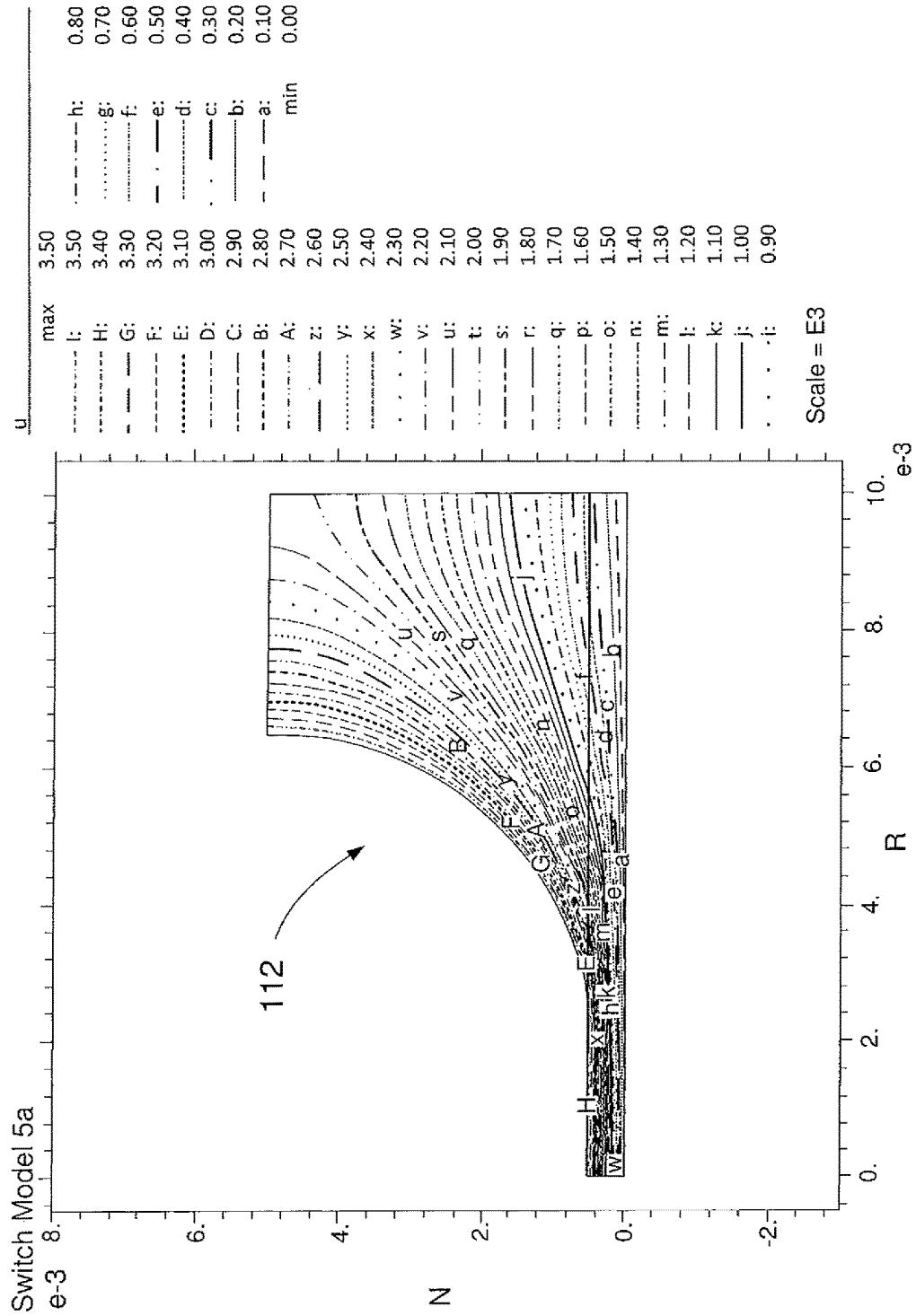
FIG. 4 is an equipotential plot illustrating how the doping of the dielectric material around the Triple Point, as shown in FIG. 3, of a photoconductive switch minimizes the field enhancement phenomenon.

Referring to FIG. 3, a portion of a photoconductive switch 100 is shown in accordance with one embodiment of the present disclosure. The switch 100 includes an electrode 102, which may be a metallized layer, which is formed on a substrate 104. A dielectric material layer 106 is positioned adjacent to the substrate 104 and the electrode 102. In this example the substrate 104 has a width that is substantially similar to or equal to a width of the electrode 102. The Triple Point is denoted by reference number 108. In this embodiment the switch 100 includes doping 110 in the dielectric material layer 106 which makes the dielectric material layer partially conductive. When the dielectric material layer 106 is made partially conductive, carriers cannot accumulate at the boundary of the substrate, but will just pass through the Triple Point interface and eventually arrive at the electrode 102. The field enhancement at the Triple Point will thus be substantially reduced or eliminated. This is further illustrated in the equipotential plot 112 shown in FIG. 4. FIG. 4 shows the equipotential plot when the substrate 104 is in the conducting state for the case that the dielectric material layer 106 is doped to be partially conducting. This results in an equipotential distribution that is similar to that shown in FIG. 1 when the substrate is non-conducting.

Referring to FIG. 5, a photoconductive switch 200 in accordance with another embodiment of the present disclosure is shown. The photoconductive switch 200 may include a housing 202 having optically clear windows 204 at one or both ends for receiving optical input signals to activate (i.e., close) the switch. Within the housing 202 is a substrate 206 on which are mounted a pair of electrodes 208 and 210. In this embodiment, the substrate 206 is comprised of a first conductive material section 206a bounded on opposing sides by second non-conductive material sections 206b. Dielectric material sections 212 are positioned on the conductive material portion 206b and adjacent the electrodes 208 and 210. An important feature is that inner edges 206b1 of the non-conductive material sections 206b are arranged so that they are positioned inward of the radiused opposing edges or corners 208a and 210a of the electrodes 208 and 210. In this manner, the radial extent of the conductive material portion 206a of the substrate 206 does not overlap the dielectric material portions 212. The second non-conductive material sections 206b of the substrate 206 may be comprised of optically clear plastic or any other material which is non-conductive in response to an optical signal incident thereon. The construction of the switch 200 also substantially reduces or eliminates the accumulation of charge carriers at the Triple Points 214.

Referring to FIG. 6, a photoconductive switch 300 is shown in accordance with another embodiment of the present disclosure. The switch 300 in this embodiment includes a spherical metalized material section forming an electrode 302, and a substrate 304 having a boundary edge surface 304a which extends normally to the surface of the electrode 302. A dielectric waveguide material 306 is included which may be made from epoxy, oil or any other suitable dielectric material, and which has a boundary edge surface 306a matching the contour of the boundary edge surface 304a. The switch 300 solves the problem of charge accumulation at the Triple Point, indicated by reference number 308, by arranging the boundary edge surface 304a of the substrate 304 so that no charge accumulation will result when the switch 300 is switched on. The efficacy of this configuration can be understood by examining the electric field lines in the substrate 304 of the switch 300 when the switch is in the "On" state. When a radial boundary of the substrate 304 is shaped so that it is tangent to the static field lines, then when the substrate 304 is conducting, charge can flow along these same field lines to the electrode 302 without ever intersecting a boundary with the dielectric 306 of the switch 300. Thus, no charge accumulation will occur at the interface of the boundary edge surfaces 304a and 306a, and no enhancement (i.e., charge accumulation) will result at this boundary.

When the photoconductive switch 300 shown in FIG. 6 uses the spherically shaped electrode 302, then the substrate boundary edge surface 304a has an arc shape. However, the electrode 302 can have any curvilinear or non-planar shape and the substrate boundary (interface between boundary edge surfaces 304a and 306a) is chosen to conform to the electric field lines when the substrate is in the "Off" state. The resulting boundary will naturally be normal to the electrode 302, and in this example, curvilinear, since the electric field must be normal to the electrode, and will be tangent to the field lines in the "Off" state. Accordingly, there is virtually no difference between the "Off" and "On" states of the substrate 304. The fundamental reason underlying this approach is that, with the boundary edge surfaces 304a/306a are shaped as described above, the differential equations that determine the potential in the substrate and the boundary conditions have the same form whether the substrate is "On" or "Off", and thus the solutions have the same form.

One of the advantages of this approach is that the results are largely insensitive to the nature of the material placed radially outwardmost from the substrate 304. The relative dielectric constant of the dielectric waveguide material 306 can be almost anything without perturbing the potential inside the substrate 304. Another advantage is that the electric field along the boundary edge surface 304a of the substrate 304 is much less than that between the electrodes at that closest point since the length of the boundary is much longer than the distance between the electrodes at their point of closest approach, and there is no field enhancement at the Triple Point.

The foregoing description of the various embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

What is claimed is:

1. A photoconductive switch comprising:
   a substrate;
   an electrode formed on the substrate;
   a dielectric formed adjacent to the substrate and the electrode, the dielectric, the electrode and the substrate each including a portion cooperatively defining an interface area; and
   the interface area of the dielectric including a doping making the interface area of the dielectric electrically conductive to suppress a charge collection at the interface area when the photoconductive switch is electrically energized through an input signal irradiating the electrode.

2. The photoconductive switch of claim 1, wherein the electrode forms a planar component.

3. The photoconductive switch of claim 1, wherein only the interface area of the dielectric includes the doping.

4. The photoconductive switch of claim 3, wherein the substrate has a width substantially similar or identical to a width of the electrode.

5. The photoconductive switch of claim 3, wherein the electrode forms a metallized layer of material.

6. A photoconductive switch comprising:
   a substrate having a conducting portion and non-conducting material portions arranged on opposing side edges of the conducting portion;
   an electrode formed on the substrate;
   a dielectric formed adjacent to the non-conducting material portions, the dielectric having material portions each forming an interface area with the non-conducting material portions on opposing edges of the non-conducting material portions; and
   the interface area operative to suppress a charge collection at the interface area when the photoconductive switch is electrically energized through an input signal irradiating the electrode.

7. The photoconductive switch of claim 6, wherein the non-conducting material portions each comprise a non-conducting, transparent material.

8. The photoconductive switch of claim 7, wherein the non-conducting material portions each comprise a silicon dioxide.

9. The photoconductive switch of claim 6, wherein the electrode forms a metallized layer of material.

10. The photoconductive switch of claim 6, wherein the non-conducting material portions each have edges which are disposed inwardly of opposing side edges of the electrode so that a radial extent of the conducting portion of the substrate does not overlap either of the dielectric material portions.

11. A photoconductive switch comprising:
 a substrate;
 an electrode formed on the substrate;
 the substrate having a first boundary edge surface;
 a dielectric formed adjacent to the first boundary edge surface of the substrate and to the electrode, the dielectric having a second boundary edge surface conforming to the first boundary edge surface and to at least a portion of the electrode; and
 and wherein an intersection of the first and second boundary edge surfaces forms a plane normal to a surface of the electrode.

12. The photoconductive switch of claim 11, wherein the electrode comprises a spherical electrode.

13. The photoconductive switch of claim 11, wherein the electrode comprises a non-planar shape.

14. The photoconductive switch of claim 11, wherein the intersection of the first and second boundary edge surfaces forms a curvilinear surface.

15. A method for forming a photoconductive switch comprising:
 forming a substrate;
 forming an electrode on the substrate;
 arranging a dielectric formed adjacent to the substrate and the electrode;
 the dielectric, the electrode and the substrate each including a portion cooperatively defining an interface area; and
 at the interface area of the dielectric, including a doping making the interface area of the dielectric electrically conductive to suppress a charge collection at the interface area when the photoconductive switch is electrically energized through an input signal irradiating the electrode.

* * * * *